(12) United States Patent
Kojima

(10) Patent No.: US 7,772,892 B2
(45) Date of Patent: Aug. 10, 2010

(54) DIFFERENTIAL HYBRID CIRCUIT

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 9 days.

(21) Appl. No.: 12/354,715

(22) Filed: Jan. 15, 2009

(65) Prior Publication Data

US 2010/0176846 A1    Jul. 15, 2010

(51) Int. Cl.
    *H03K 5/22* (2006.01)
(52) U.S. Cl. .................. 327/65; 327/91; 327/361
(58) Field of Classification Search .......... 327/63, 327/65, 91, 94, 355, 361
    See application file for complete search history.

(56) References Cited

U.S. PATENT DOCUMENTS

| | | | | |
|---|---|---|---|---|
| 2,725,532 A | 11/1955 | Radcliffe, Jr. | ............... | 333/11 |
| 3,725,582 A | 4/1973 | Davis | ................... | 178/58 |
| 5,793,230 A * | 8/1998 | Chu et al. | ............... | 327/77 |
| 6,133,725 A | 10/2000 | Bowhers | ............... | 324/158.1 |
| 6,563,298 B1 | 5/2003 | Creek et al. | ............ | 324/158.1 |
| 6,909,980 B2 | 6/2005 | Fernando | ............... | 702/66 |
| 7,121,132 B2 | 10/2006 | Ibane | ...................... | 73/1.42 |
| 7,176,823 B2 * | 2/2007 | Zabroda | ................... | 341/144 |
| 7,373,574 B2 | 5/2008 | Kojima | .................... | 714/738 |
| 7,397,289 B2 | 7/2008 | Kojima | .................... | 327/161 |

FOREIGN PATENT DOCUMENTS

| | | |
|---|---|---|
| JP | 08-023354 A | 1/1996 |
| JP | 2006-023233 | 1/2006 |
| WO | WO/2005/081004 | 1/2005 |

* cited by examiner

*Primary Examiner*—Jeffrey S Zweizig
(74) *Attorney, Agent, or Firm*—Martine Penilla & Gencarella, LLP

(57) ABSTRACT

A main driver amplifier generates first differential signals (Vdp/Vdn) based on pattern data (PAT). A replica driver amplifier generates second differential signals (Vcp/Vcn) based on the pattern data (PAT). Two subtractors generate electric potential difference signals (HP=RP−Vep) and (HN=RN−Ven), respectively. Two sample hold circuits sample the electric potential difference signals (HP and HN), and hold them thereafter, respectively. A comparison unit compares a differential amplitude signal (DA=HHP−HHN) with a predetermined threshold value (VOH). A latch circuit latches an output from the comparison unit. Sampling timings of the two sample hold circuits and a latch timing of the latch circuit, can be adjusted independently.

4 Claims, 7 Drawing Sheets

(a)

(b)

(a)

(b)

(c)

DIFFERENTIAL HYBRID CIRCUIT

BACKGROUND OF THE INVENTION

1. Field of the Invention

The present invention relates to a technique for testing a semiconductor device, in particular, to a technique for evaluating signals with a differential form outputted from a device to be tested.

2. Description of the Related Art

In recent years, differential transmission systems have been widely used among digital home appliances such as TV sets, DVD (Digital Versatile Disc) players, in order to transmit video signals and audio signals at high speeds. The differential transmission systems are expected to be used in data transmission among devices such as memories and CPUs (Central Processing Units) in the near future.

For example, XDR-DRAM (eXtreme Data Rate Dynamic Random Access Memory) transmits bidirectionally a pair of differential signals (hereinafter, simply referred to as differential signals) at a high speed by using single differential signal wires. In the case of testing a device with such a bidirectional differential interface, amplitudes of the differential signals outputted from a device to be tested (DUT) are measured, by which good or bad is determined with respect to the DUT.

FIGS. 1A and 1B are block diagrams illustrating part of the structure of a test apparatus for testing a device with a differential interface. As illustrated in FIG. 1A, a test system 300 is provided with a pin electronics PE and a test fixture TF. A DUT 200 is fixed to a socket board (SB). The pin electronics PE is provided with a differential comparator 110. The differential comparator 110 is also referred to as a timing comparator, which receives differential signals UP/UN outputted from the DUT 200, and determines levels of the differential signals UP/UN at a timing synchronized with the strobe signal. Herein, "P/N" represents a pair of differential signals. A pair of differential signal wires 50P/50N (hereinafter, also referred to collectively as differential signal wires 50) that connects the socket board SB and the pin electronics PE, is provided on the test fixture TF.

FIG. 1B is a circuit diagram illustrating a structure of the differential comparator 110. The differential comparator 110 includes a subtractor 112, a first comparator 114, a second comparator 116, a first latch 118, and a second latch 120. The subtractor 112 generates a difference between the differential signals RP and RN, that is, a differential amplitude signal DA. The first comparator 114 compares the differential amplitude signal DA with a higher threshold voltage VOH. The first latch 118 latches a comparison result SH at a timing of a first strobe signal Hstb. The second comparator 116 compares the differential amplitude signal DA with a lower threshold voltage VOL. The second latch 120 latches a comparison result SL at a timing of a second strobe signal Lstb. Logic values of the data SH and SL indicating the comparison results are determined based on the following equations (1A) and (1B):

$$SH = \mathrm{sign}(VOH - (RP - RN)) \quad (1A)$$

$$SL = \mathrm{sign}((RP - RN) - VOL) \quad (1B)$$

wherein sign(x) is a function value of which is 1 when x>0, and 0 when x<0.

Ideally, lengths of the pair of the differential signal wires 50 formed on the test fixture TF are the same; however, in an actual test apparatus, the lengths thereof are sometimes different. FIGS. 2A and 2B are charts illustrating operation waveforms of the differential comparator 110 in the cases where the lengths of the differential lines are the same or different, respectively. As illustrated in FIG. 2A, in the case where the lengths of the differential signal wires 50 are the same, the differential signals UP/UN outputted from the DUT 200 reach the differential comparator 110 with the same delay tpd (RP/RN).

Transition from the low-level (0) to the high-level (1) of the differential amplitude signal (RP–RN) is taken into consideration. The outputs SH and SL from the two comparators 114 and 116 are latched at timings of the strobe signals Hstb and Lstb, between them a time difference Tcr being present.

Based on a combination of the latched signals (fail signals) FH and FL, a transition time T from a low-level (<VOL) to a high-level (>VOH) of the differential amplitude signal (RP–RN) is determined whether the time T is shorter than a predetermined value Tcr or not. In FIG. 2A, signals FH and FL are both at the low-levels; hence, it is determined that T<Trc holds.

FIG. 2B illustrates the case where the lengths of the differential signal wires 50P/50N are different, and a delay amount of the differential signal UN is longer than that of the differential signal UP, by a predetermined time te. In this case, a waveform of the differential amplitude signal (RP–RN) that is expected to have been outputted properly from the DUT 200 becomes weak within the test apparatus, such that the fail signal FH is determined to be at the high-level and the fail signal FL to be at the low-level; therefore, the transition time T is determined erroneously to be longer than the predetermined value Tcr.

For example, when a variable-length coaxial cable (trombone) is provided on a pathway in series to the test fixture TF, an imbalance between the differential lines can be canceled by changing a length of the coaxial cable. However, the variable-length coaxial cable is expensive and large-sized; hence it is unrealistic that the variable-length coaxial cable is provided to each differential line of the test apparatus, in particular, the test apparatus provided with hundreds to thousands of channels. Further, the variable-length coaxial cable is a device line length of which is changed mechanically, and hence the cable is difficult to be adjusted quickly.

The whole differential signal wires 50 may also be formed by using lines excellent in a symmetrical property, such as twisted pair; however, in the case, when a phase difference or an asymmetric property is present in the differential signals UP/UN from the DUT 200, the signals are averaged during propagation, making it difficult to evaluate a true waveform from the DUT 200 on the side of the test apparatus. It is an original advantage with the differential line that an asymmetric property of waveforms is averaged on the way of the transmission line; however, it becomes a disadvantage from a viewpoint of test apparatuses.

Other techniques to deal with an imbalance between differential line lengths are disclosed in Patent Documents 1 to 3.

A test apparatus for testing a DUT with a bidirectional differential interface is provided with a transmitter and a receiver that are connected to a pair of differential signal wires (hereinafter, also simply referred to as differential signal wires) in common. The transmitter transmits a test pattern to the DUT; and the receiver determines a logical value of the differential signals outputted from the DUT, or checks amplitude of a difference voltage of a pair of the differential signals.

The receiver of the test apparatus is connected to the transmitter on the side of the test apparatus via a pair of the differential signal wires as well as connection to the DUT. Accordingly, it is necessary to design the test apparatus for testing a DUT with a bidirectional differential interface, such that the receiver is not affected by an output from an adjacent transmitter. In some of the Patent Documents (in particular, Patent Documents 5 to 7), a circuit that receives only signals from the other end by canceling transmission signals outputted from itself (hybrid circuit) is disclosed.

[Patent Document 1] U.S. Pat. No. 7,397,289
[Patent Document 2] U.S. Pat. No. 6,909,980 B2
[Patent Document 3] International Patent Publication Pamphlet No. 05/081004
[Patent Document 4] U.S. Pat. No. 7,121,132
[Patent Document 5] Japanese Patent Application Laid-Open No. 2006-23233
[Patent Document 6] Japanese Patent Application Laid-Open No. S47-011702
[Patent Document 7] Japanese Patent Application Laid-Open No. H8-023354
[Patent Document 8] U.S. Pat. No. 2,725,532
[Patent Document 9] U.S. Pat. No. 6,133,725
[Patent Document 10] U.S. Pat. No. 6,563,298
[Patent Document 11] U.S. Pat. No. 7,373,574

SUMMARY OF THE INVENTION

The present invention has been made under these situations, and one of exemplary purposes thereof is to provide a bidirectional differential interface capable of canceling influence by transmission differential signals supplied to a device to be tested from a driver while canceling an imbalance between differential lines, in evaluating reception differential signals from the device to be tested.

An embodiment of the present invention relates to a differential hybrid circuit that not only receives reception differential signals outputted from a device to be tested via differential lines, and compares a differential amplitude of the reception differential signals with a predetermined threshold voltage, but also supplies transmission differential signals to the device to be tested via the differential lines. The differential hybrid circuit comprises: a first input/output (I/O) terminal to which one of the reception differential signals and one of the transmission differential signals are inputted/outputted; a second I/O terminal to which the other of the reception differential signals and the other of the transmission differential signals are inputted/outputted; a main driver amplifier that generates first differential signals based on pattern data to be transmitted to the device to be tested; a first resistance provided between one of output terminals of the main driver amplifier and the first I/O terminal; a second resistance provided between the other output terminal of the main driver amplifier and the second I/O terminal; a replica driver amplifier that generates second differential signals based on the pattern data; a third resistance first terminal of which is connected to one of output terminals of the replica driver amplifier; a fourth resistance first terminal of which is connected to the other output terminal of the replica driver amplifier; a first subtractor that generates a first electric potential difference signal corresponding to an electric potential difference between an electric potential at the first I/O terminal and an electric potential at the second terminal of the third resistance; a second subtractor that generates a second electric potential difference signal corresponding to an electric potential difference between an electric potential at the second I/O terminal and an electric potential at the second terminal of the fourth resistance; a first sample hold circuit that samples the first electric potential difference signal at a designated timing, and holds it thereafter; a second sample hold circuit that samples the second electric potential difference signal at a designated timing, and holds it thereafter; a comparison unit that compares a signal corresponding to a difference between respective output signals from the first and the second sample hold circuits, with a predetermined threshold value; and a latch circuit that latches an output from the comparison unit. The sampling timings of the first and the second sample hold circuits and a latch timing of the latch circuit, can be adjusted independently.

The device to be tested and the differential hybrid circuit are connected with a pair of differential lines consisting of a positive wire and a negative wire, and the line lengths of the two wires are sometimes different. In the case, an error in the line lengths can be canceled by adjusting the sampling timings of the first and the second sample hold circuits in accordance with a difference between the line lengths. This means that pure differential signals outputted from the device to be tested can be evaluated properly. Moreover, an amplitude of the reception differential signals from the DUT can be determined while influence by an output from the main driver amplifier on an input voltage in the comparison unit is being canceled, by providing the replica driver amplifier.

The first sample hold circuit may also include:

a first switch, a first capacitor, and a second switch, which are provided in series in this order between the first I/O terminal and the second terminal of the third resistance; a first voltage source that generates a first reference voltage by shifting a predetermined voltage in an amount of an electric potential difference corresponding to the threshold voltage; and a third switch provided between a connecting point between the second switch and the first capacitor, and the first voltage source. The first sample hold circuit may execute at respective timings corresponding to the strobe signal: a step in which the first and the second switches are in on states, and the third switch is in an off state; and a step in which the first and the second switches are in off states, and the third switch is in an on state. The second sample hold circuit may also include: a fourth switch, a second capacitor, and a fifth switch, which are provided in series in this order between the second I/O terminal and the second terminal of the fourth resistance; a second voltage source that generates a second reference voltage by shifting a predetermined voltage in an amount of an electric potential difference corresponding to the threshold voltage; and a sixth switch provided between a connecting point between the fifth switch and the second capacitor, and the second voltage source. The second sample hold circuit may execute at respective timings corresponding to the strobe signal: a step in which the fourth and the fifth switches are in on states, and the sixth switch is in an off state; and a step in which the fourth and the fifth switches are in off states, and the sixth switch is in an on state. The comparison unit may also compare an electric potential at a connecting point between the first switch and the first capacitor, with an electric potential at a connecting point between the fourth switch and the second capacitor. The latch circuit may also latch an output from the comparison unit at the timing corresponding to the strobe signal.

In this embodiment, a high-speed analogue subtractor is not needed because the functions of the first and the second subtractors are realized equivalently by operations with the use of capacitors. Thereby, there is an advantage that the degree of difficulty in designing circuits can be reduced, or implementation by using a cheap CMOS process is possible.

The differential hybrid circuit according to an embodiment may further include a replica load circuit. The replica load circuit may also include: a single-ended amplifier; a fifth resistance provided between an output terminal of the single-ended amplifier and the third resistance; and a sixth resistance provided between the output terminal of the single-ended amplifier and the fourth resistance. By providing the replica load circuit, a load condition of the replica driver amplifier can be made almost the same as that of the main driver.

Another embodiment of the present invention is a test apparatus. The test apparatus comprises a first differential hybrid circuit and a second differential hybrid circuit. The first differential hybrid circuit receives reception differential signals outputted from a device to be tested, and compares a differential amplitude of the reception difference signals, with a predetermined higher threshold voltage. The second differential hybrid circuit receives the reception differential signals outputted from the device to be tested, and compares the differential amplitude of the reception differential signals, with a predetermined lower threshold voltage. The first and the second differential hybrid circuits are structured by any embodiment stated above, and share the first and the second I/O terminals, the main driver amplifier, the replica driver amplifier, and the resistances of the first resistance to the fourth resistance.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Herein, "the state where a member A is connected to a member B" includes not only the state where the member A is physically and directly connected to the member B but also the state where the member A is indirectly connected to the member B via another member that does not affect electrically the connection state between them. Likewise, "the state where a member C is provided between a member A and a member B" includes not only the state where the member A and the member C, or the member B and the member C, are connected directly, but also the state where they are connected indirectly via another member that does not affect electrically the connection state between them.

Figure 1:
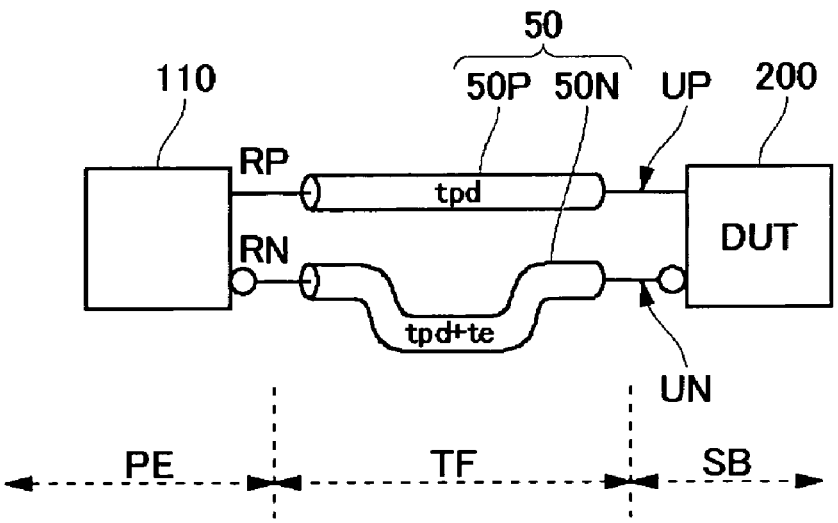
FIGS. 1A and 1B are block diagrams illustrating part of the structure of a test apparatus for testing a device with a differential interface.
Figure 1:
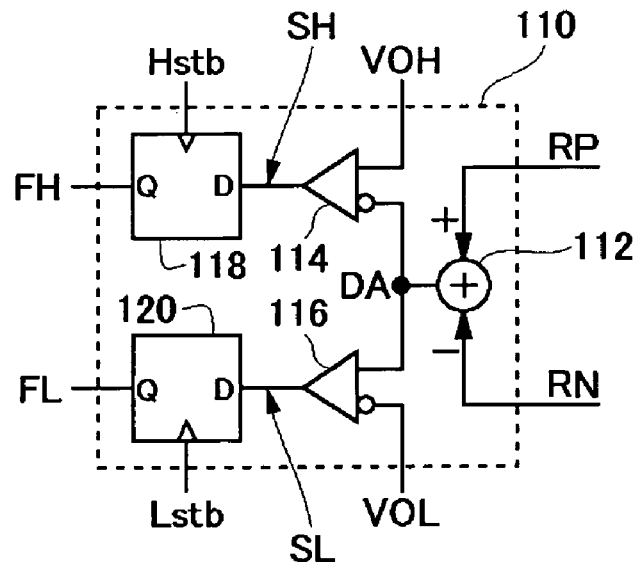
Figure 2:
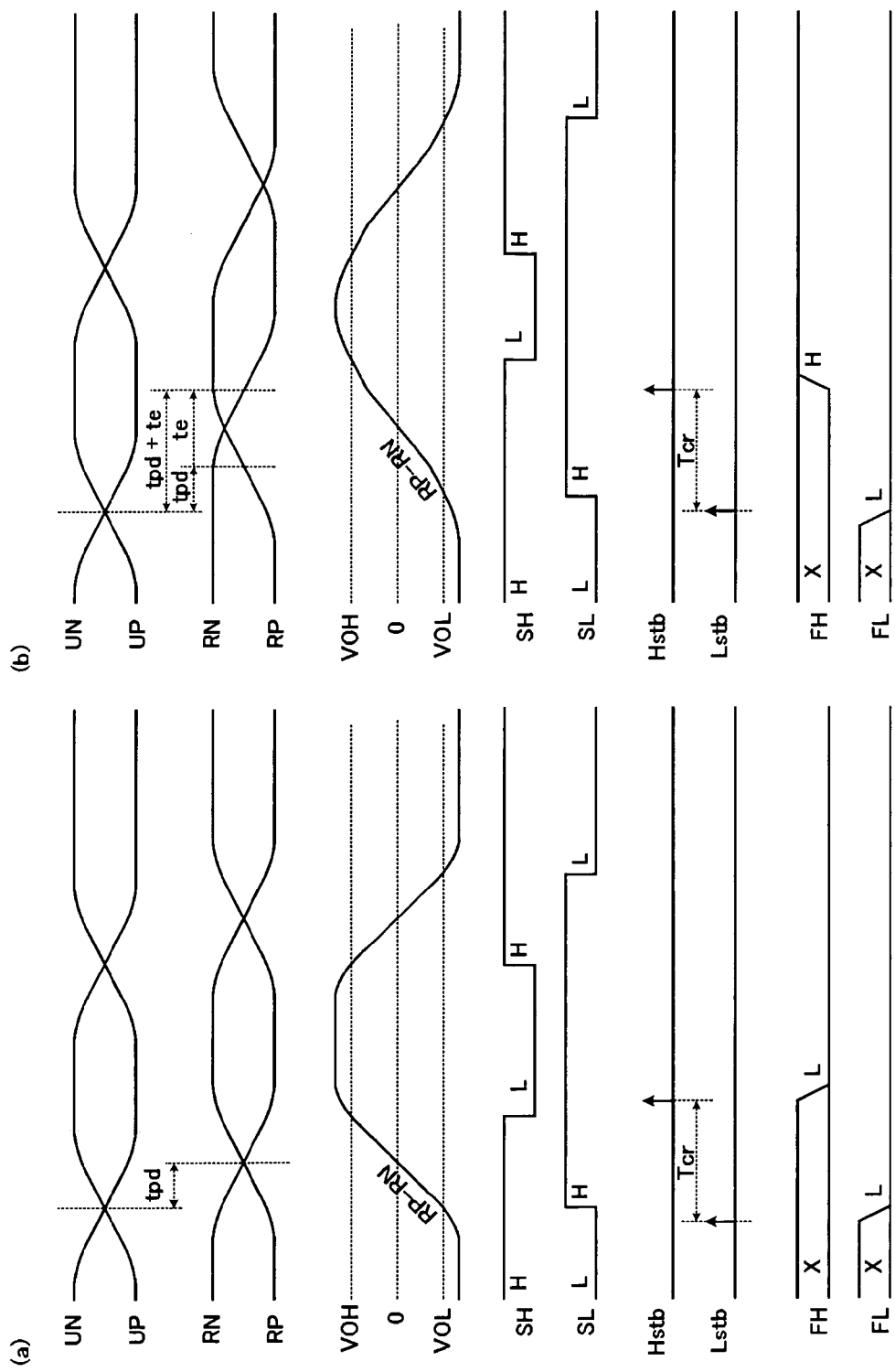
FIGS. 2A and 2B are charts illustrating operation waveforms of differential comparator in the cases where the lengths of differential lines are the same or different, respectively.
Figure 3:
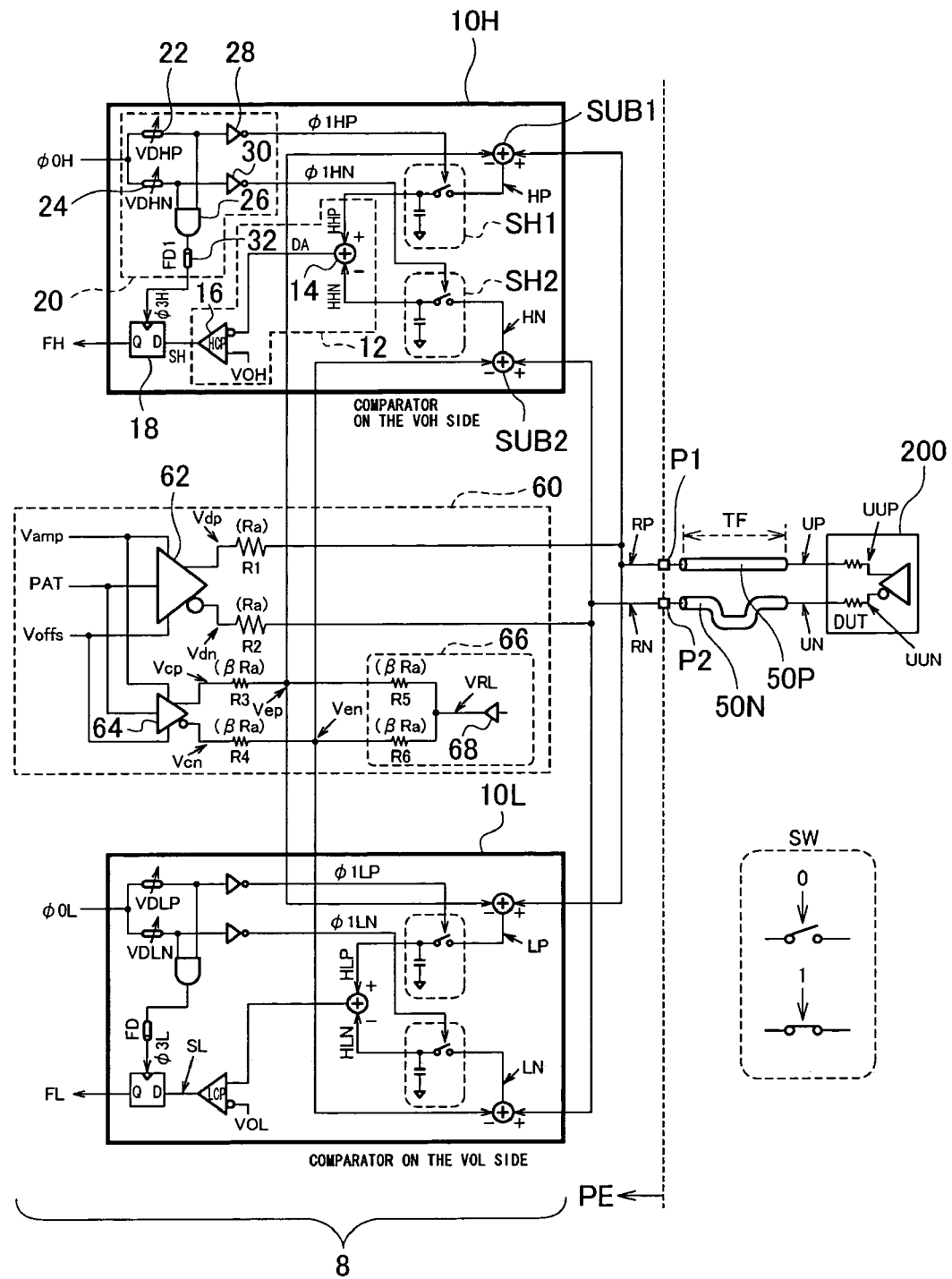
FIG. 3 is a circuit diagram illustrating part of the structure of the test apparatus directed to an embodiment.

FIG. 3 is a circuit diagram illustrating part of the structure of the test apparatus 100 directed to the embodiments. The test apparatus 100 is provided with the pin electronics PE and the test fixture TF. The DUT 200 outputs output signals UP/UN with a differential form (hereinafter, referred to as reception differential signals). The reception differential signals UP/UN are inputted to the first I/O terminal P1 and the second I/O terminal P2 of the pin electronics PE via the differential signal wires 50P/50N formed in the test fixture TF.

The pin electronics PE includes at least one of differential hybrid circuits 8. Although a differential hybrid circuit is illustrated in FIG. 3, a plurality of differential hybrid circuits are usually provided in an actual test apparatus 100.

The differential hybrid circuit 8 includes: a High-side differential comparator 10H; a Low-side differential comparator 10L; and a driver unit 60. The differential hybrid circuit 8 has two functions as follows: (1) a function as a timing comparator that evaluates levels of the reception differential signals RP/RN based on timings of inputted strobe signals $\phi 0H$ and $\phi 0L$, and (2) a function as a driver that supplies transmission differential signals to the DUT 200 via the differential signal wires 50P/50N.

A driver unit 60 on the transmission side will be at first described. The driver unit 60 includes: a main driver amplifier 62; a replica driver amplifier 64; resistances of the first resistance R1 to the fourth resistance R4; and a replica load circuit 66.

The main driver amplifier 62 generates first differential signals Vdp/Vdn based on pattern data PAT to be transmitted to the DUT 200. The replica driver amplifier 64 generates second differential signals Vcp/Vcn based on the pattern data PAT.

The first resistance R1 is provided between one of output terminals (non-inverted output terminal) of the main driver amplifier 62 and the first I/O terminal P1. The second resistance R2 is provided between the other output terminal (inverted output terminal) of the main driver amplifier 62 and the second I/O terminal P2. One end (first terminal) of the third resistance R3 is connected to one of the output terminals (non-inverted output terminal) of the replica driver amplifier 64. One end (first terminal) of the fourth resistance R4 is connected to the other output terminal (inverted output terminal) of the replica driver amplifier 64.

Resistance values of the first and the second resistances R1 and R2 are equally Ra, and preferably the same as a characteristic impedance of the differential signal wires 50. Also, resistance values of the third and the fourth resistances R3 and R4 are equally $\beta \times Ra$, wherein $\beta$ is a parameter.

As will be described later, the replica driver amplifier 64, the third resistance R3, and the fourth resistance R4 are provided in order to cancel the first differential signals Vdp/Vdn outputted from the main driver amplifier 62.

The replica load circuit 66 includes a single-ended amplifier 68, a fifth resistance R5, and a sixth resistance R6. The single-ended amplifier 68 outputs a predetermined voltage VRL. The predetermined voltage VRL is canceled at the final stage, and hence the value thereof does not have a particular meaning; however, it is also acceptable that the value is made the same as, for example, a common voltage of the differential signals UUP/UUN generated within the DUT 200. The fifth resistance R5 is provided between the output terminal of the single-ended amplifier 68 and the second terminal of the third resistance R3. The sixth resistance R6 is provided between the output terminal of the single-ended amplifier 68 and the second terminal of the fourth resistance R4. Resistance values of the fifth and the sixth resistances R5 and R6 are equally β×Ra. A load condition of the replica driver amplifier 64 is almost the same as that of the main driver amplifier 62 due to the replica load circuit 66.

A ratio of drive capability (sometimes referred to as current supply capability) of the main driver amplifier 62 and the replica driver amplifier 64, in other words, a size ratio of transistors (in particular, transistors at the output stage) constituting the amplifiers, is preferably about β: 1. With such a design, the balances of the drive capability and the load resistances between the main drive amplifier 62 and the replica drive amplifier 64, can be made the same.

When β=1, sizes of the main drive amplifier 62 and the replica drive amplifier 64 are at the same level. From viewpoints of power consumption and circuit area, it is preferable that the replica driver amplifier 64 is smaller in its size. Accordingly, β is preferably larger than 1; however, it is preferably about 10 from a practical viewpoint.

Figure 4:
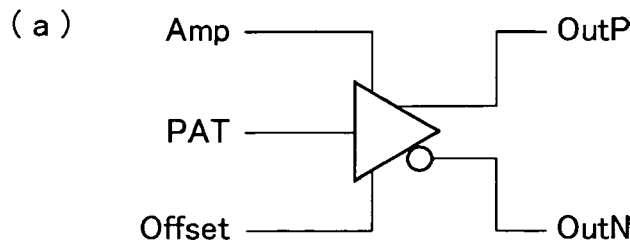
FIGS. 4A to 4C are diagrams illustrating structures and performance of a main driver amplifier and a replica driver amplifier.
Figure 4:
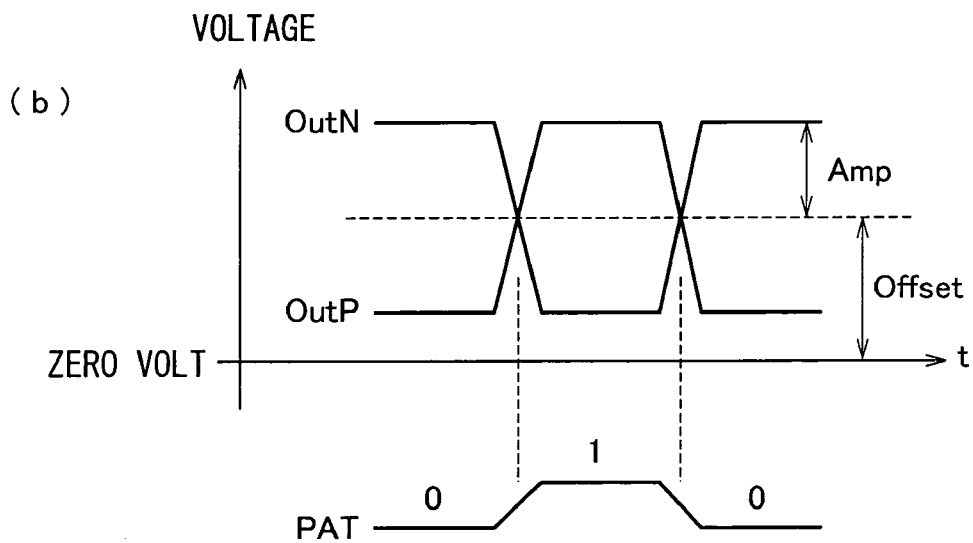
Figure 4:
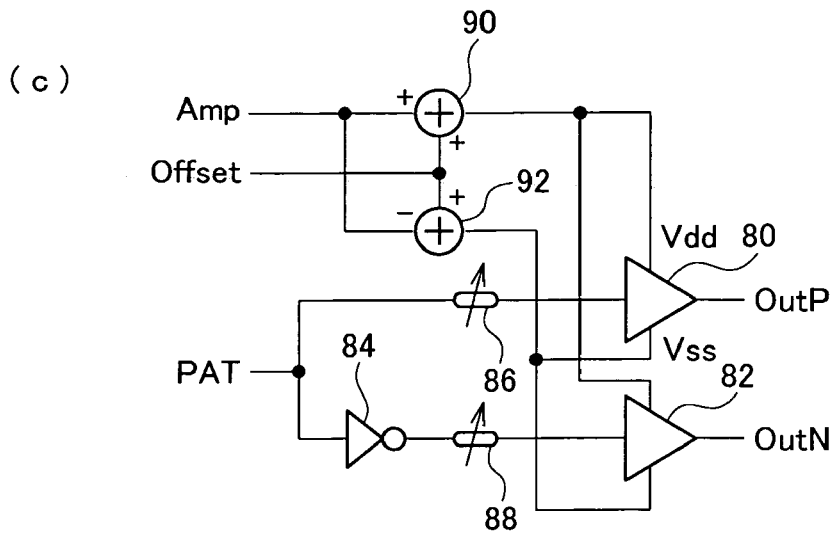

FIGS. 4A to 4C are diagrams illustrating structures and performance of the main driver amplifier 62 and the replica driver amplifier 64. FIG. 4A illustrates circuit symbols of the amplifier, and FIG. 4B illustrates operation waveforms. "Amp" represents half-value amplitude of differential output signals OutP and OutN, and "Offset" represents bias voltage (common voltage) thereof. When the input signal PAT is 1, the non-inverted output OutP and the inverted output OutN are respectively, OutP=Offset+Amp and OutN=Offset−Amp. When the input signal PAT is 0, OutP=Offset−Amp and OutN=Offset+Amp hold.

The amplifier illustrated by the circuit symbol in FIG. 4A only indicates the state where an amplitude and a common voltage of the amplifier have values represented by Amp and Offset; hence the amplifier is not needed to have terminals for setting the amplitude and common voltage.

The main driver amplifier 62 and the replica driver amplifier 64 may be structured by a pure differential amplifier having the above functions, or may have the structure illustrated in FIG. 4C. The differential amplifier in FIG. 4C includes a first buffer 80, a second buffer 82, an inverter 84, a first delay circuit 86, a second delay circuit 88, an analogue adder 90, and an analogue subtractor 92.

The analogue adder 90 adds the half-value amplitude Amp and the common voltage Offset, and supplies it to the upper power terminals (Vdd) of the buffers 80 and 82. The analogue subtractor 92 subtracts the half-value amplitude Amp from the common voltage Offset, and supplies it to the lower power terminals (Vss) thereof.

The first delay circuit 86 provides a delay to the pattern data PAT. The buffer 80 outputs the delayed pattern data PAT as a non-inverted output OutP. The inverter 84 inverts the pattern data PAT, and the second delay circuit 88 provides a delay to the inverted pattern data. The buffer 82 outputs the inverted and delayed pattern data PAT as an inverted output OutN.

According to the amplifier in FIG. 4C, a skew between the non-inverted output OutP and the inverted output OutN can be adjusted by the delay circuits 86 and 88 as well as adjustment of the differential amplitude and the common voltage.

The structure of the driver unit 60 has been described above. Subsequently referring back to FIG. 3, the structures of the differential comparators 10H and 10L will be described.

The differential comparator 10H compares a differential amplitude component DA (=RP−RN) of the reception differential signals RP/RN, with a predetermined higher threshold voltage VOH. The differential comparator 10L compares the differential amplitude component (RP−RN) with a predetermined lower threshold voltage VOL.

The differential comparators 10H and 10L have the same structures, and therefore description will be made hereinafter taking only the High-side differential comparator 10H into consideration. The Low-side differential comparator 10L will be understood when the suffix "H" of the symbols noted to each signal and member is replaced with "L". In addition, a switch SW illustrated herein are meant to be turned off when 0 (low-level) is inputted as a control signal, and to be turned on when 1 (high-level) is inputted, as illustrated by the symbol in lower right of FIG. 3. As such a switch, an analogue switch, for example, transfer gate or the like, can be used suitably.

The differential comparator 10H includes, a first sample hold circuit SH1, a second sample hold circuit SH2, a comparison unit 12, a latch circuit 18, a timing control unit 20, a first subtractor SUB1, and a second subtractor SUB2.

A non-inverted component (hereinafter, referred to as a positive signal) RP, one of the reception differential signals RP/RN, is inputted to the first I/O terminal P1. An inverted component (hereinafter, referred to as a negative signal) RN, the other of the reception differential signals RP/RN, is inputted to the second I/O terminal P2.

The first subtractor SUB1 generates a first electric potential difference signal HP corresponding to an electric potential difference (RP−Vep) between an electric potential RP at the first I/O terminal P1 and an electric potential Vep at the second terminal of the third resistance R3. Likewise, the second subtractor SUB2 generates a second electric potential difference signal HN corresponding to an electric potential difference (RN−Ven) between an electric potential RN at the second I/O terminal P2 and an electric potential Ven at the second terminal of the fourth resistance R4.

The first sample hold circuit SH1 samples the first electric potential difference signal HP generated by the first subtractor SUB1 at a timing (for example, a timing of the negative edge) designated by the first control signal (hold signal) φ1HP, and thereafter holds the sampled value HP$_{HOLD}$ (hold mode). During a period preceding the sampling timing, an output signal HHP from the first sample hold circuit SH1 agrees with the input signal HP (tracking mode).

Likewise, the second sample hold circuit SH2 samples the second electric potential difference signal HN generated by the second subtractor SUB2 at a timing (for example, a timing of the negative edge) designated by the second control signal (hold signal) φ1HN, and thereafter holds the sampled value HN$_{HOLD}$ (hold mode). During a period preceding the sampling timing, an output signal HHN from the second sample hold circuit SH2 agrees with the input signal HN (tracking mode).

In other words, the first and the second sample hold circuits SH1 and SH2 serve as outputting (tracking) the input signals as they are, and as sampling and holding the signals at designated timings.

In FIG. 3, the first and the second sample hold circuits SH1 and SH2 are in the tracking modes when a switch SW is turned on, and sample and hold the sampled values when the switch SW is turned off. The first and the second sample hold circuits SH1 and SH2 include switches SW and capacitors C, respectively, but the structures thereof are not limited to that of FIG. 3, and the modification examples, which will be described later, and other structures not described herein may also be adopted.

The comparison unit 12 compares a difference between the output signal (hold positive signal) HHP from the first sample hold circuit SH1 and the output signal (hold negative signal) HHN from the second sample hold circuit SH2, or a differential amplitude signal DA corresponding to a differential amplitude (HHP−HHN), with the higher threshold voltage VOH. As a result of the comparison, a comparison signal SH, which is at the low-level when (HHP−HHN)>VOH and at the high-level when (HHP−HHN)<VOH, is outputted.

In FIG. 3, the comparison unit 12 is structured so as to include the subtractor 14 and the comparator 16. The subtractor 14 subtracts the hold negative signal HHN from the hold positive signal HHP in an analog fashion. For example, the subtractor 14 may also be a subtractor including a combination of a resistance and an operating amplifier, or another type of subtractors. The comparator 16 compares the differential amplitude signal DA outputted from the subtractor 14 with the threshold voltage VOH. As illustrated by various modification examples described later, the structure of the comparison unit 12 is not limited to that in FIG. 3.

The latch circuit 18 latches the comparison signal SH at a timing (for example, positive edge) corresponding to a third control signal φ3H. The fail signal FH thus latched is inputted to a decision circuit (not illustrated).

The timing control unit 20 generates the control signals φ1HP, φ1HN, and φ3H, based on the strobe signal φ0H that is inputted from outside and is a reference signal, and controls the first sample hold circuit SH1, the second sample hold circuit SH2, and the latch circuit 18. A transition timing of each of the control signals φ1HP, φ1HN, and φ3H can be adjusted arbitrarily. That is, sampling timings of the first sample hold circuit SH1 and the second sample hold circuit SH2, and a latch timing of the latch circuit 18, can be adjusted independently.

The timing control unit 20 includes a first delay circuit 22, a second delay circuit 24, a first AND gate 26, a first inverter 28, a second inverter 30, and a third delay circuit 32. The first delay circuit 22 and the second delay circuit 24 branch the strobe signal φ0H, each of which providing a first and a second variable delays VDHP and VDHN to the strobe signal φ0H. The first inverter 28 inverts an output signal from the corresponding first delay circuit 22, and outputs the inverted signal to the first sample hold circuit SH1 as the first control signal φ1HP. The second inverter 30 inverts an output signal from the corresponding second delay circuit 24, and outputs the inverted signal to the second sample hold circuit SH2 as the second control signal φ1HN.

The first AND gate 26 generates an AND of the output signals from the first delay circuit 22 and the second delay circuit 24. An output signal from the first AND gate 26 makes a transition following either the first control signal φ1HP or the second control signal φ1HN, which makes a transition later than the other. The third delay circuit 32 provides a third delay FD1 to the output signal from the first AND gate 26, and outputs the signal as the third control signal φ3H. Accordingly, the latch circuit 18 latches the comparison signal SH outputted from the comparison unit 12, with an elapse of the third delay FD1 from the timing when both the first control signal φ1HP and the second control signal φ1HN are in the hold modes.

The structure of the differential comparator 10H has been described.

Figure 5:
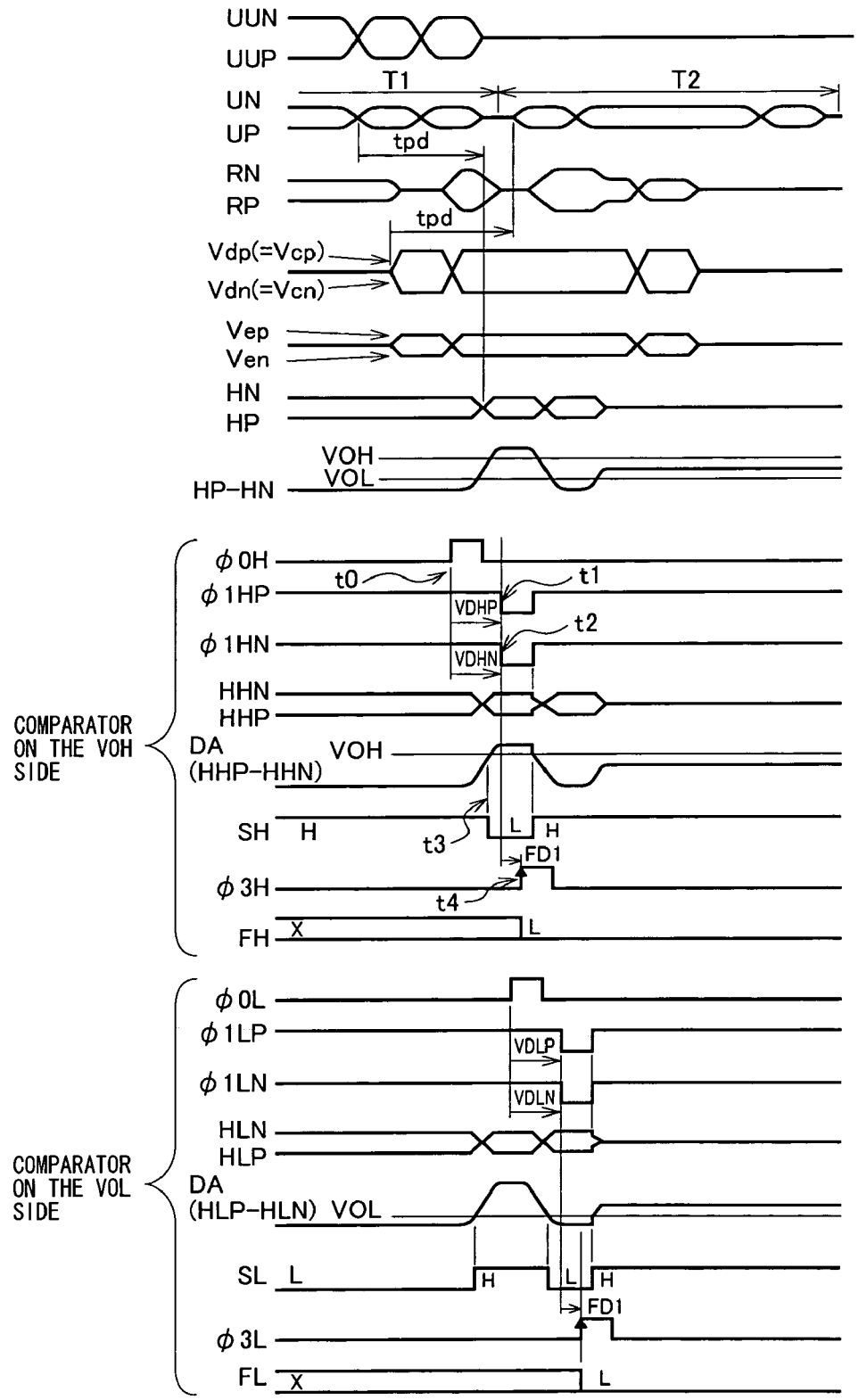
FIG. 5 is time charts illustrating performance of the test apparatus in FIG. 3.

Subsequently, performance of the test apparatus 100 in FIG. 3 will described. FIG. 5 is time charts illustrating performance of the test apparatus 100 in FIG. 3. A period T1 is one when the test apparatus 100 receives signals from the DUT 200, and a period T2 is one when the test apparatus 100 transmits signals to the DUT 200.

The main driver amplifier 62 and the replica driver amplifier 64 generate almost the same differential signals. That is, Vdp=Vcp and Vdn=Vcn hold. Herein, it is assumed that the main driver amplifier 62, the replica driver amplifier 64, and the DUT 200 are ideal amplifiers each output impedance of which is 0, for ease of explanation.

In the circuit diagram in FIG. 3, voltages of the differential signals RP, RN, Vep and Ven are given as follows:

$$RP=(Vdp+UUP)/2 \quad (2a)$$

$$RN=(Vdn+UUN)/2 \quad (2b)$$

$$Vep=(Vcp+VRL)/2 \quad (2c)$$

$$Ven=(Vcn+VRL)/2 \quad (2d)$$

The electric potential difference signals HP and HN are generated by the first and the second subtractors SUB1 and SUB2 of the differential comparator 10H as follows:

$$HP=RP-Vep$$

$$HN=RN-Ven.$$

The differential comparator 10H is now taken into consideration. Prior to a testing of the DUT 200, it is assumed that a difference between the transmission lengths of the differential signal wires 50P/50N, that is, a propagation time difference te is measured in advance. The error te in the propagation times can be measured by the method, for example, disclosed in U.S. Pat. No. 7,121,132. As a result of the measurement, it is assumed that a propagation time through one of the differential signal wires 50 is represented by tpd, and that through the other differential signal wire is represented by tpd+te.

In both of the differential comparator 10H side and the differential comparator 10L side, the first variable delay VDHP (VDLP) and the second variable delay VDHN (VDLN) are set based on a measured error te. Specifically, delay amounts of the first delay circuit 22 and the second delay circuit 24 are adjusted so as to satisfy the following equations:

$$VDHN=VDHP+te$$

$$VDLN=VDLP+te.$$

With this adjustment, the timing when the second control signal φ1HN gives a command for sampling to the second sample hold circuit SH2, lags behind the timing when the first control signal φ1HP gives that to the first sample hold circuit SH1, by the time difference te.

It is assumed that, in the time chart in FIG. 5, te=0, and propagation delays of the differential signal wires 50P and 50N are the same, for ease of explanation. Before the time t0, the strobe signal φ0H is at the low-level, and the first and the second control signals φ1HP and φ1HN are both at the high-level. During this period, the first and the second sample hold circuits SH1 and SH2 are both set in the tracking mode.

At the time t0, the strobe signal φ0H makes a transition to the high-level. When the first control signal φ1HP makes a transition to the low-level at the time t1 with an elapse of the first variable delay VDHP from the time t0, the first sample hold circuit SH1 is set in the hold mode to sample a value of the first electric potential difference signal HP and hold it thereafter.

When the second control signal φ1HN makes a transition from the high-level to the low-level, at the time t2 with an elapse of the first variable delay VDHN from the time t0, the second sample hold circuit SH2 is set in the hold mode to sample a value of the second electric potential difference signal HN and hold it thereafter. As stated above, when te=0, the times t1 and t2 agree with each other.

Herein, the differential amplitude signal DA (=HHP−HHN) outputted from the subtractor 14 is taken into consideration. Values of the differential amplitude signal (HHP−HHN) change as follows in accordance with the states of the first and the second sample hold circuits SH1 and SH2:

(1) before the time t1

In this state, the first and the second sample hold circuits SH1 and SH2 are both in the tracking mode:

$$HHP = HP$$

$$HHN = HN.$$

Taking the differential amplitude signal DA in this period into consideration, $DA = HP - HN = (RP - Vep) - (RN - Ven)$ (3) holds. When equations (2a) to (2d) are substituted into equation (3), and when it is assumed that the main driver amplifier 62 and the replica driver amplifier 64 generate almost the same differential signals, $DA = (UUP - UUN)/2$ is obtained. This equation does not include the signals Vdp and Vpn generated by the main driver amplifier 62, but includes only the signals UUP/UUN generated by the DUT 200. From the result, it can be understood that, according to the test apparatus 100 in FIG. 3, influence by the transmission differential signals on the reception differential signals can be preferably eliminated.

(2) from the time t1 to the time t2

In this period, the first sample hold circuit SH1 is in the hold mode, and the second sample hold circuit SH2 is in the tracking mode. This period is not included in the time chart in FIG. 5:

$$HHP = HP_{HOLD}$$

$$HHN = HN$$

$$DA = HP_{HOLD} - HN.$$

(3) after the time t2

In this state, the first and the second sample hold circuits SH1 and SH2 are both in the hold mode:

$$HHP = HP_{HOLD}$$

$$HHN = HN_{HOLD}$$

$$DA = HP_{HOLD} - HN_{HOLD}.$$

When the differential amplitude signal DA crosses the threshold voltage VOH at the time t3 between the time t0 and the time t1, the comparison signal SH makes a transition from the high-level to the low-level.

At the time t4 with a further elapse of the delay time FD1 from the times t1 and t2 when the first and the second sample hold circuits SH1 and SH2 are both in the hold mode, the third control signal φ0H makes a transition to the high-level, and the latch circuit 18 latches an output from the comparison unit 12. At the time, the comparison signal SH is at the low-level, and hence a value of the fail signal FH is fixed to the low-level.

As illustrated in the lower portion of FIG. 5, the differential comparator 10L performs in the same way as with the differential comparator 10H on the basis of the strobe signal φ0L. The fail signal FL at the low-level is generated by the differential comparator 10L.

Performance of the test apparatus 100 has been described above. According to the test apparatus 100, influence by transmission differential signals Vdp/Vdn supplied to the DUT 200 from the driver unit 60, can be canceled, in evaluating the reception differential signals UP/UN from the DUT 200. Moreover, an imbalance between the line lengths of the differential signal wires 50P/50N can be canceled by optimizing the values of the delay amounts VDHP, VDHN, VDLP, VDLN, and FD.

Figure 6:
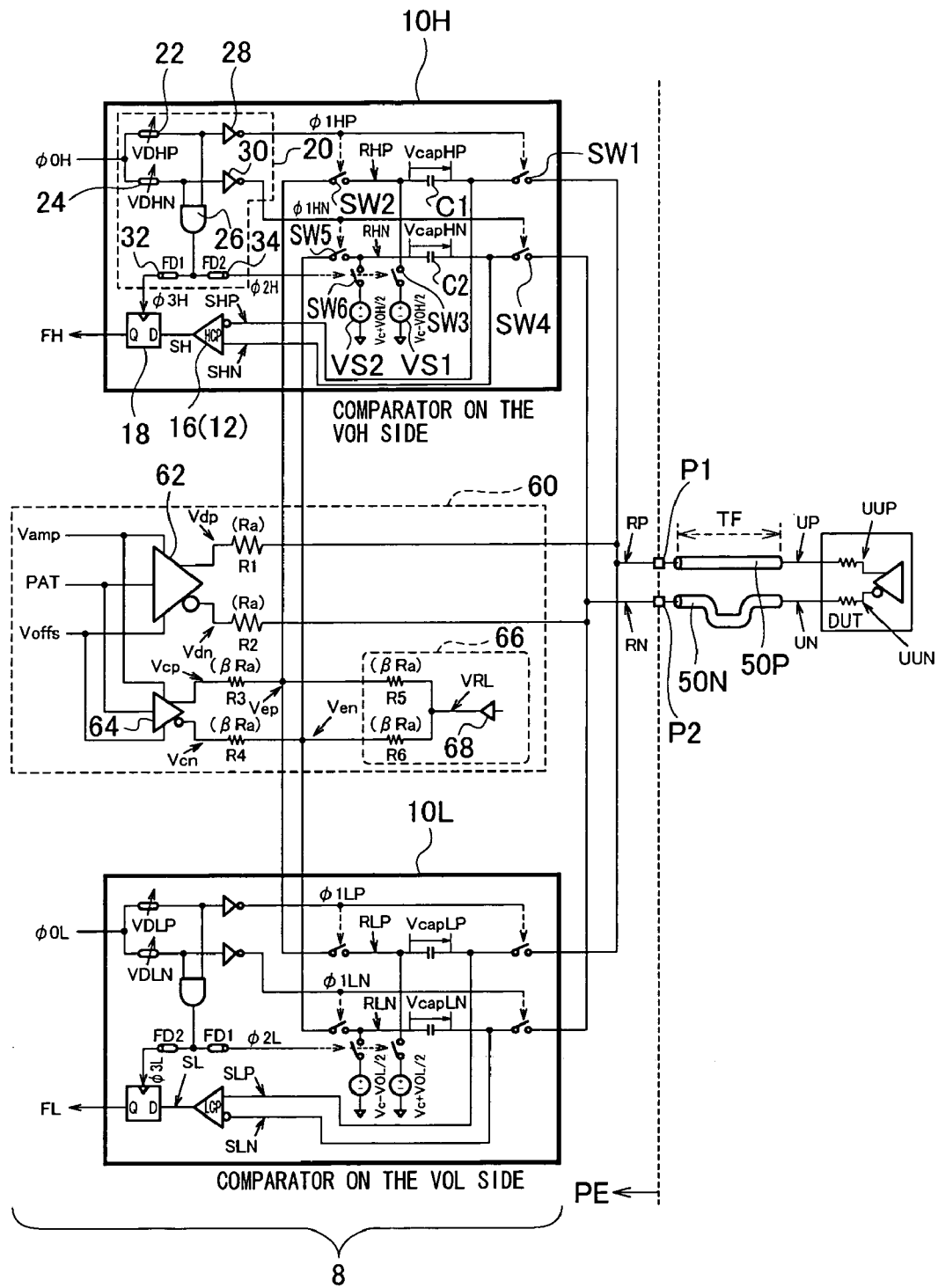
FIG. 6 is a circuit diagram illustrating another example of the structure of the test apparatus directed to an embodiment.

FIG. 6 is a circuit diagram illustrating another example of the structure of the test apparatus 100 directed to the embodiments. The first and the second sample hold circuits SH1 and SH2 in FIG. 6 have also the functions of the subtractor 14, the first subtractor SUB1, and the second subtractor SUB2, in addition to the functions of the first and the second sample hold circuits SH1 and SH2 in FIG. 3.

The first sample hold circuit SH1 includes a first capacitor C1, switches of a first switch SW1 to a third switch SW3, and a first voltage source VS1. The first switch SW1, the first capacitor C1, and the second switch SW2, are provided in series in this order between the first I/O terminal P1 and the second terminal of the third resistance R3. The first voltage source VS1 generates a first reference voltage (Vc−VOH/2) by shifting a predetermined voltage Vc to the lower electric potential side in an amount of an electric potential difference (VOH/2) corresponding to the threshold voltage VOH. The voltage Vc may also be half the voltage of a power source, or a common voltage of the differential signals RP/RN, or another constant voltage. The third switch SW3 is provided between a connecting point between the second switch SW2 and the first capacitor C1, and the first voltage source VS1.

The second sample hold circuit SH2 includes a second capacitor C2, switches of a fourth switch SW4 to a sixth switch SW6, and a second voltage source VS2. The structure thereof is the same as with the first sample hold circuit SH1. The second voltage source VS2 generates a second reference voltage (Vc+VOH/2) by shifting the predetermined voltage Vc to the higher electric potential side in an amount of the electric potential difference (VOH/2) corresponding to the threshold voltage VOH.

The timing control unit 20 generates control signals φ1HP, φ1HN, φ2H, and φ3H, after receiving the strobe signal φ0H. The timing control unit 20 in FIG. 6 further includes a fourth delay circuit 34 in addition to those in FIG. 3. The fourth delay circuit 34 provides a delay FD2 to an output signal from the first AND gate 26 to generate the control signal φ2H.

The first and the second switches SW1 and SW2 are controlled by the common control signal φ1HP. The fourth and fifth switches SW4 and SW5 are controlled by the common signal φ1HN. The third and the sixth switches SW3 and SW6 are controlled by the control signal φ2H.

The first sample hold circuit SH1 performs the following processing:

1. Tracking Mode

When φ1HP=1, φ1HN=1, and φ2H=0, the first and the second switches SW1 and SW2 are in on states, and the third switch SW3 is in an off state, and hence VcapHP=RP−Vep and VcapHN=RN−Ven hold.

2. Hold Mode

When switching to φ1HP=0 and φ1HN=0, the first and the second switches SW1 and SW2 are turned off. As a result, the electric potential difference until then is held in the first capacitor C1:

$$VcapHP = RP_{HOLD} - Vep_{HOLD}$$

$$VcapHN = RN_{HOLD} - Ven_{HOLD}.$$

3. Operate Mode

When switching to φ2H=1, the third switch is turned on. As a result, electric potentials of the first and the second capacitors C1 and C2 are shifted, such that the operations of SHP=Vc−VOH/2+VcapHP and SHN=Vc+VOH/2+VcapHN, are performed.

The comparator 16 (comparison unit 12) compares an electric potential SHP at the connecting point between the first switch SW 1 and the first capacitor C1, with an electric potential SHN at the connecting point between the fourth switch SW4 and the second capacitor C2. As a result, a comparison signal SH, which is given by SH=sign(SHN−SHP)=sign(VOH−(VcaoHP−VcapHN)), is generated. The equation is further rearranged to SH=sign(VOH−(UUP−UUN)/2) by using equation (3); hence, it can be understood that only the signal components generated by the DUT 200 are evaluated and determined by the comparator 16.

The same processing is performed in the second sample hold circuit SH2.

Figure 7:
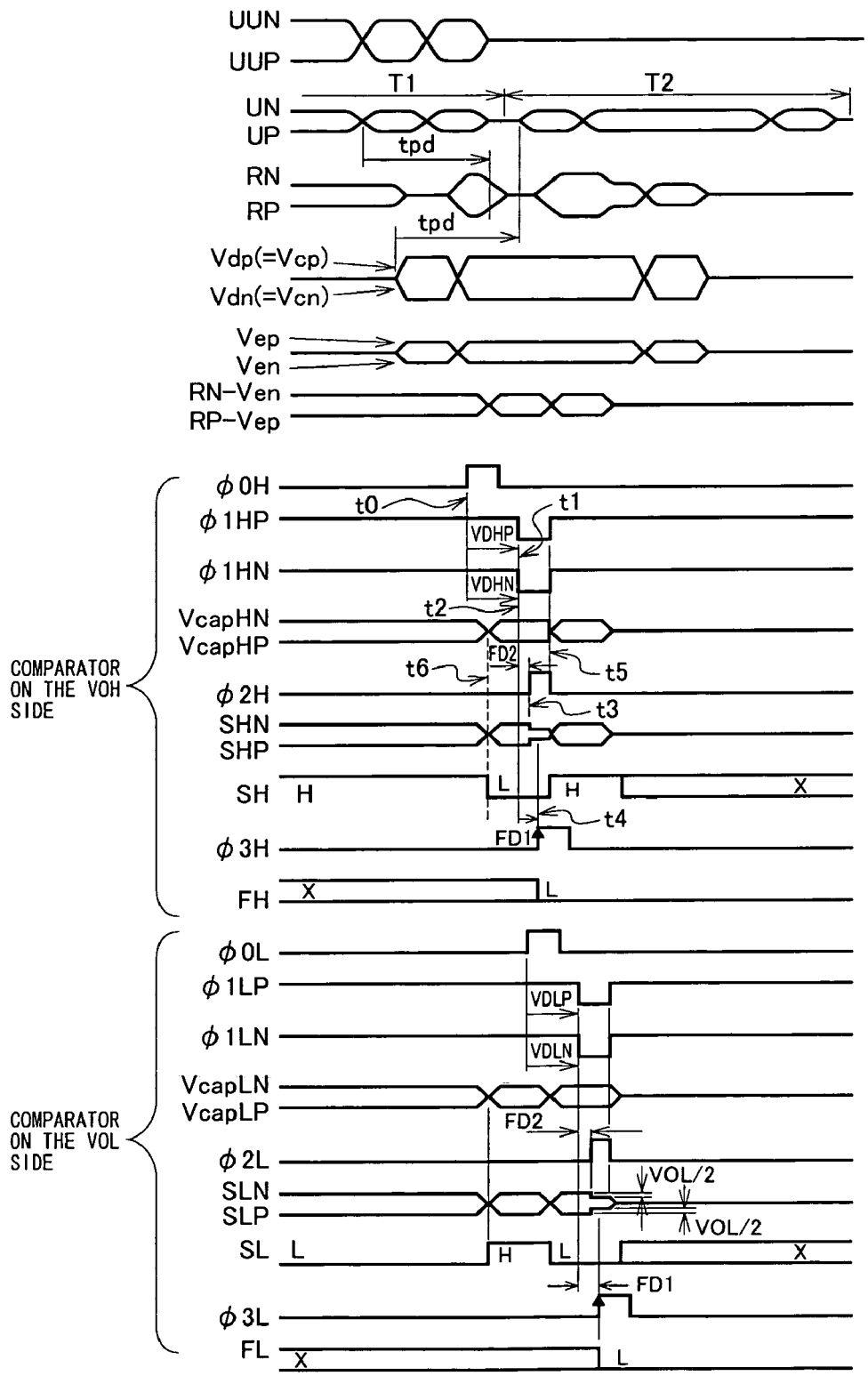
FIG. 7 is time charts illustrating performance of the test apparatus in FIG. 6.

The structure of the test apparatus 100 in FIG. 6 has been described above. Subsequently, performance of the test apparatus 100 will be described. FIG. 7 is time charts illustrating performance of the test apparatus 100 in FIG. 6.

Before the time t0, the strobe signal φ0H is at the low-level, and the control signals φ1HP and φ1HN are both at the high-level. During this period, each of the first and the second capacitors C1 and C2 is charged (tracking mode).

At the time t0, the strobe signal φ0H makes a transition to the high-level. When the control signal φ1HP makes a transition from the high-level to the low-level, at the time t1 with an elapse of the first variable delay VDHP from the time t0, the first and the second switches SW1 and SW2 are turned off, and the voltage VcapHP of the first capacitor C1 is held (hold mode).

When the control signal φ1HN makes a transition from the high-level to the low-level, at the time t2 with an elapse of the second variable delay VDHN from the time t0, the fourth and the fifth switches SW4 and SW5 are turned off, and the voltage VcapHN of the second capacitor C2 is held. When te=0, the times t1 and t2 agree with each other, the situation thereof being illustrated in FIG. 7.

When the two input signals SHP and SHN of the comparator 16 cross each other at the time t6 between the time t0 and the time t1, the comparison signal SH makes a transition to the low-level.

At the time t3 with an elapse of the delay time FD2 from the time t2, the control signal φ2H is at the high-level, and the third and the sixth switches SW3 and SW6 are turned on (operate mode). When the third switch SW3 is turned on, an electric potential SHP at the connecting point between the first capacitor C1 and the first switch SW1 is shifted to a value represented by the equation: SHP=Vc−VOH/2+VcapHP. Likewise, when the sixth switch SW6 is turned on, an electric potential SHN at the connecting point between the second capacitor C2 and the fourth switch SW4, is shifted to a value represented by the equation: SHN=Vc+VOH/2+VcapHN.

At the time t4 with a further elapse of the delay time FD1 from the times t1 and t2 when the first and the second sample hold circuits SH1 and SH2 are both in the hold mode, the third control signal φ3H makes a transition to the high-level, and the latch circuit 18 latches an output from the comparison unit 12. At the time, the comparison signal SH is at the low-level, and hence a value of the fail signal FH is fixed to the low-level.

When the control signals φ1HP and φ1HN make transitions to the high-level and the control signal φ2H makes a transition to the low-level at the time t5, the first and the second sample hold circuits SH1 and SH2 are both in the tracking mode again.

Performance of the test apparatus 100 in FIG. 6 has been described above. According to the test apparatus 100 in FIG. 6, influence by the transmission differential signals on the reception differential signals can be preferably eliminated, as with the test apparatus 100 in FIG. 3. Moreover, by adjusting the delay times VDHP and VDHN, an imbalance between the line lengths of the differential signal wires 50P/50N can be canceled, and pure differential signals UP/UN outputted from the DUT 200 can be evaluated properly.

In addition, operations by transferring charges of the first and the second capacitors C1 and C2 are used in the test apparatus 100 in FIG. 6; hence, the analogue subtractors (SUB1, SUB2, 14) used in FIG. 3, are not needed. In the circuit illustrated in FIG. 3, a high-speed amplifier that can follow reception differential signals with a high-bit rate, which are outputted from the DUT 200, is needed; and such an amplifier is difficult to be designed. On the other hand, in the test apparatus 100 in FIG. 6, such a high-speed amplifier is not needed, and thereby the degree of the difficulty in designing circuits can be reduced.

While the preferred embodiments of the present invention have been described using specific terms, such description is for illustrative purposes only, and it is to be understood that changes and variations may be made without departing from the spirit or scope of the appended claims.

What is claimed is:

1. A differential hybrid circuit that receives reception differential signals outputted from a device to be tested via differential lines, and compares a differential amplitude of the reception differential signals with a predetermined threshold voltage, as well as supplying transmission differential signals to the device to be tested via the differential lines, the differential hybrid circuit comprising:

a first I/O terminal to which one of the reception differential signals and one of the transmission differential signals are inputted/outputted;

a second I/O terminal to which the other of the reception differential signals and the other of the transmission differential signals are inputted/outputted;

a main driver amplifier that generates first differential signals based on pattern data to be transmitted to the device to be tested;

a first resistance provided between one of output terminals of the main driver amplifier and the first I/O terminal;

a second resistance provided between the other output terminal of the main driver amplifier and the second I/O terminal;

a replica driver amplifier that generates second differential signals based on the pattern data;

a third resistance first terminal of which is connected to one of output terminals of the replica driver amplifier;

a fourth resistance first terminal of which is connected to the other output terminal of the replica driver amplifier;

a first subtractor that generates a first electric potential difference signal corresponding to an electric potential difference between an electric potential at the first I/O terminal and an electric potential at the second terminal of the third resistance;

a second subtractor that generates a second electric potential difference signal corresponding to an electric potential difference between an electric potential at the second I/O terminal and an electric potential at the second terminal of the fourth resistance;

a first sample hold circuit that samples the first electric potential difference signal at a designated timing, and holds it thereafter;

a second sample hold circuit that samples the second electric potential difference signal at a designated timing, and holds it thereafter;

a comparison unit that compares a signal corresponding to a difference between respective output signals from the first and the second sample hold circuits, with a predetermined threshold value; and a latch circuit that latches an output from the comparison unit, wherein the sampling timings of the first and the second sample hold circuits and a latch timing of the latch circuit, can be adjusted independently.

2. The differential hybrid circuit according to claim 1, wherein the first sample hold circuit includes:

a first switch, a first capacitor, and a second switch, which are provided in series in this order between the first I/O terminal and the second terminal of the third resistance;

a first voltage source that generates a first reference voltage by shifting a predetermined voltage in an amount of an electric potential difference corresponding to the threshold voltage; and a third switch provided between a connecting point between the second switch and the first capacitor, and the first voltage source, and wherein the first sample hold circuit executes at respective timings corresponding to the strobe signal:

a step in which the first and the second switches are in on states, and the third switch is in an off state;

a step in which the first and the second switches are turned off; and a step in which the first and the second switches are in off states, and the third switch is in an on state, and wherein the second sample hold circuit includes:

a fourth switch, a second capacitor, and a fifth switch, which are provided in series in this order between the second I/O terminal and the second terminal of the fourth resistance;

a second voltage source that generates a second reference voltage by shifting a predetermined voltage in an amount of an electric potential difference corresponding to the threshold voltage; and a sixth switch provided between a connecting point between the fifth switch and the second capacitor, and the second voltage source, and wherein the second sample hold circuit executes at respective timings corresponding to the strobe signal:

a step in which the fourth and the fifth switches are in on states, and the sixth switch is in an off state; a step in which the fourth and the fifth switches are turned off; and a step in which the fourth and fifth switches are in off states, and the sixth switch is in an on state, and wherein the comparison unit compares an electric potential at a connecting point between the first switch and the first capacitor, with an electric potential at a connecting point between the fourth switch and the second capacitor, and wherein the latch circuit latches an output from the comparison unit at respective timings corresponding to the strobe signal.

3. The differential hybrid circuit according to claim 1, wherein the differential hybrid circuit further comprises a replica load circuit including:

a single-ended amplifier;

a fifth resistance provided between an output terminal of the single-ended amplifier and the third resistance; and a sixth resistance provided between the output terminal of the single-ended amplifier and the fourth resistance.

4. A test apparatus comprising:

a first differential hybrid circuit according to claim 1 that receives reception differential signals outputted from a device to be tested, and compares a differential amplitude of the reception differential signals, with a predetermined higher threshold voltage; and a second differential hybrid circuit according to claim 1 that receives the reception differential signals outputted from the device to be tested, and compares the differential amplitude of the reception differential signals, with a predetermined lower threshold voltage, wherein the first and the second differential hybrid circuits share the first and the second I/O terminals, the main driver amplifier, the replica driver amplifier, and resistances of the first resistance to the fourth resistance.

* * * * *